United States Patent
Jung et al.

(10) Patent No.: US 7,973,898 B2
(45) Date of Patent: Jul. 5, 2011

(54) ARRAY SUBSTRATE, DISPLAY PANEL HAVING THE SAME AND A METHOD THEREOF

(75) Inventors: Young-Bae Jung, Hwaseong-si (KR);
Dong-Hwan Kim, Suwon-si (KR);
Jin-Tak Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 796 days.

(21) Appl. No.: 11/956,494

(22) Filed: Dec. 14, 2007

(65) Prior Publication Data
US 2008/0218653 A1    Sep. 11, 2008

(30) Foreign Application Priority Data
Mar. 8, 2007  (KR) .................. 10-2007-0022916

(51) Int. Cl.
*G02F 1/1333*  (2006.01)
*G02F 1/1343*  (2006.01)
(52) U.S. Cl. ......... 349/139; 349/110; 349/151; 349/158
(58) Field of Classification Search .............. 349/42, 349/110, 139, 149, 151, 187, 158; 345/206; 257/59, 72; 438/30
See application file for complete search history.

(56) References Cited

U.S. PATENT DOCUMENTS
2003/0128306 A1  7/2003  Kai
2004/0245551 A1* 12/2004  Murade ................. 257/222

FOREIGN PATENT DOCUMENTS
JP  2002116425  4/2002
JP  2003043511  2/2003

* cited by examiner

*Primary Examiner* — Dung T Nguyen
*Assistant Examiner* — Tai Duong
(74) *Attorney, Agent, or Firm* — Cantor Colburn LLP (57) ABSTRACT

An array substrate includes a base substrate, a plurality of gate lines, a plurality of data lines, a plurality of pixel portions and a gate driving section. The base substrate includes a display area, a boundary area surrounding the display area and a light-blocking area surrounding the boundary area. The gate lines extend in a first direction on the base substrate. The data lines extend in a second direction crossing the first direction on the base substrate. The pixel portions are disposed in the display area and electrically connected to the gate and data lines. The gate driving section is electrically connected to the gate lines. A portion of the gate driving section overlaps the boundary area. The gate driving section overlaps the boundary area.

23 Claims, 12 Drawing Sheets

ARRAY SUBSTRATE, DISPLAY PANEL HAVING THE SAME AND A METHOD THEREOF

The present application claims priority to Korean Patent Application No. 2007-22916, filed on Mar. 8, 2007 and all the benefit accruing therefrom under §119, the contents of which are herein incorporated by reference in its entirety.

BACKGROUND OF THE INVENTION

1. Field of the Invention

The present invention relates to an array substrate and a display panel having the array substrate. More particularly, the present invention relates to an array substrate capable of reducing a light-blocking area formed at a peripheral portion, and a display panel having the array substrate.

2. Description of the Related Art

A liquid crystal display ("LCD") device has various advantageous characteristics such as thin thickness, light weight, low power consumption, etc. Thus, LCD devices have been widely used in monitors, notebook computers, cellular phones, etc. An LCD device includes an LCD panel displaying images by using optical transmissivity of liquid crystal and a backlight assembly disposed under the LCD panel to provide light to the LCD panel.

The LCD panel includes an array substrate having a plurality of pixel portions, an opposite substrate facing the array substrate and having a common electrode, a liquid crystal layer interposed between the array substrate and the opposite substrate, and a seal line interposed between the array substrate and the opposite substrate to seal the liquid crystal layer between the array substrate and the opposite substrate.

The array substrate has a display area in which the pixel electrodes are formed, a boundary area surrounding the display area and a light-blocking area surrounding the boundary area. A boundary electrode is formed in the boundary area to display black and/or white images, and a gate driving section is formed in the light-blocking area to control pixel electrodes and pixel portions.

An outer light-blocking layer is formed on the opposite substrate to correspond to the light-blocking area of the array substrate. The seal line is formed to correspond to the light-blocking area of the array substrate.

Since the gate driving section and the seal line are formed in the light-blocking area of the array substrate, a width of the light-blocking area and a width of the outer light-blocking layer are increased to thereby also increase an overall size of the LCD panel.

BRIEF SUMMARY OF THE INVENTION

An exemplary embodiment provides an array substrate capable of reducing a light-blocking area by adjusting a location of a gate driving section.

An exemplary embodiment provides a display panel having the above-mentioned array substrate.

In an exemplary embodiment, an array substrate includes a base substrate, a plurality of gate lines, a plurality of data lines, a plurality of pixel portions and a gate driving section. The base substrate includes a display area, a boundary area surrounding the display area and a light-blocking area surrounding the boundary area. The gate lines extend in a first direction and are disposed on the base substrate. The data lines extend in a second direction crossing the first direction and are disposed on the base substrate. The pixel portions are disposed in the display area and are electrically connected to the gate and data lines. The gate driving section is electrically connected to the gate lines. A portion of the gate driving section overlaps the boundary area.

In an exemplary embodiment, the gate driving section may be disposed in the boundary area and the light-blocking area. The array substrate may further include a boundary electrode disposed above and overlapping the gate driving section, and corresponding to the boundary area.

In an exemplary embodiment, the pixel portions may include a plurality of thin-film transistors ("TFTs") electrically connected to the gate and data lines and a plurality of pixel electrodes disposed in pixel unit areas that are defined in the display area and electrically connected to the TFTs.

In an exemplary embodiment, the array substrate may further include a protective layer covering the gate lines, the data lines, the TFTs and the gate driving section. The pixel electrode and the boundary electrode may be disposed on the protective layer.

In an exemplary embodiment, the array substrate may further include a common voltage line covered with the protective layer, and electrically connected to the boundary electrode through a boundary contact hole extended through the protective layer.

In an exemplary embodiment, the boundary area may include a left boundary area disposed at a left side of the display area, a right boundary area disposed at a right side of the display area, an upper boundary area disposed at an upper side of the display area and a lower boundary area disposed at a lower side of the display area.

In an exemplary embodiment, the boundary contact hole may be disposed in one of the upper and lower boundary areas. Alternatively, the boundary contact hole may be disposed in one of the left and right boundary areas, and spaced apart from the gate driving section.

In an exemplary embodiment, the boundary electrode may have an integrated form over the boundary area.

In an exemplary embodiment, a display panel includes an array substrate, an opposite substrate facing the array substrate and a liquid crystal layer interposed between the array substrate and the opposite substrate.

The array substrate includes a base substrate, a plurality of gate lines, a plurality of data lines, a plurality of pixel portions and a gate driving section. The base substrate includes a display area, a boundary area surrounding the display area and a light-blocking area surrounding the boundary area. The gate lines extend in a first direction and are disposed on the base substrate. The data lines extend in a second direction crossing the first direction and are disposed on the base substrate. The pixel portions are disposed in the display area and are electrically connected to the gate and data lines. The gate driving section is electrically connected to the gate lines. A portion of the gate driving section overlaps the boundary area.

In an exemplary embodiment, the pixel portion of the array substrate may include a plurality of thin-film transistors ("TFTS") electrically connected to the gate and data lines. The array substrate may further include a protective layer covering the gate lines, the data lines, the TFTs and the gate driving section, and a boundary electrode disposed on the protective layer, overlapping the gate driving section and corresponding to the boundary area.

In an exemplary embodiment, the opposite substrate may include an outer light-blocking layer disposed corresponding to the light-blocking area of the array substrate, and optionally includes a boundary light-blocking layer configured to cover a portion of the boundary area.

In an exemplary embodiment, the boundary electrode may have an integrated form over the boundary area. The boundary electrode may include a transmissive electrode and/or a reflective electrode.

In an exemplary embodiment, a gate driving section of an array substrate is disposed between a boundary electrode and a base substrate to overlap a boundary area, thereby reducing a width of a light-blocking area.

BRIEF DESCRIPTION OF THE DRAWINGS

The above and other features and advantage points of the present invention will become more apparent by describing in detailed exemplary embodiments thereof with reference to the accompanying drawings, in which.

DETAILED DESCRIPTION OF THE INVENTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "lower" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 1:
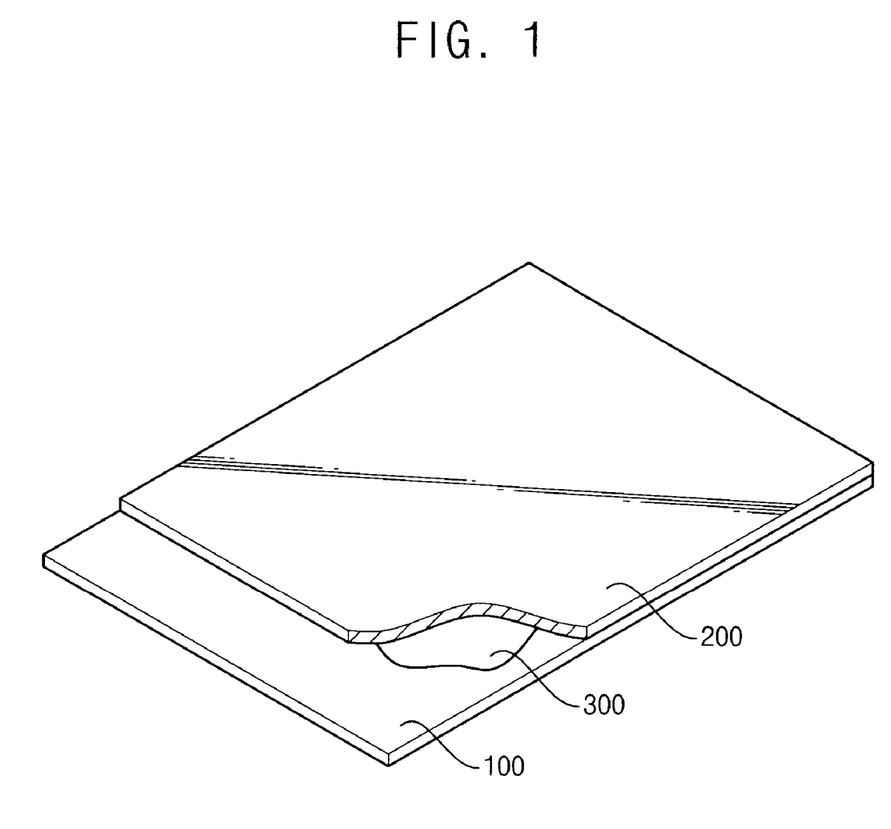
FIG. 1 is a perspective view illustrating an exemplary embodiment of a display panel according to the present invention.

FIG. 1 is a perspective view illustrating an exemplary embodiment of a display panel according to an exemplary embodiment of the present invention.

Referring to FIG. 1, the display panel includes an array substrate 100, an opposite substrate 200 and a liquid crystal layer 300.

The array substrate 100 includes pixel portions that may be arranged in a substantially matrix shape to display unit images.

The opposite substrate 200 faces the array substrate 100, and includes a common electrode formed on a substantially entire surface of the opposite substrate 200.

The liquid crystal layer 300 is interposed between the array substrate 100 and the opposite substrate 200. An electric field generated between the array substrate 100 and the opposite substrate 200 rearranges liquid crystal molecules of the liquid crystal layer 300 to change optical transmissivity.

Figure 2:
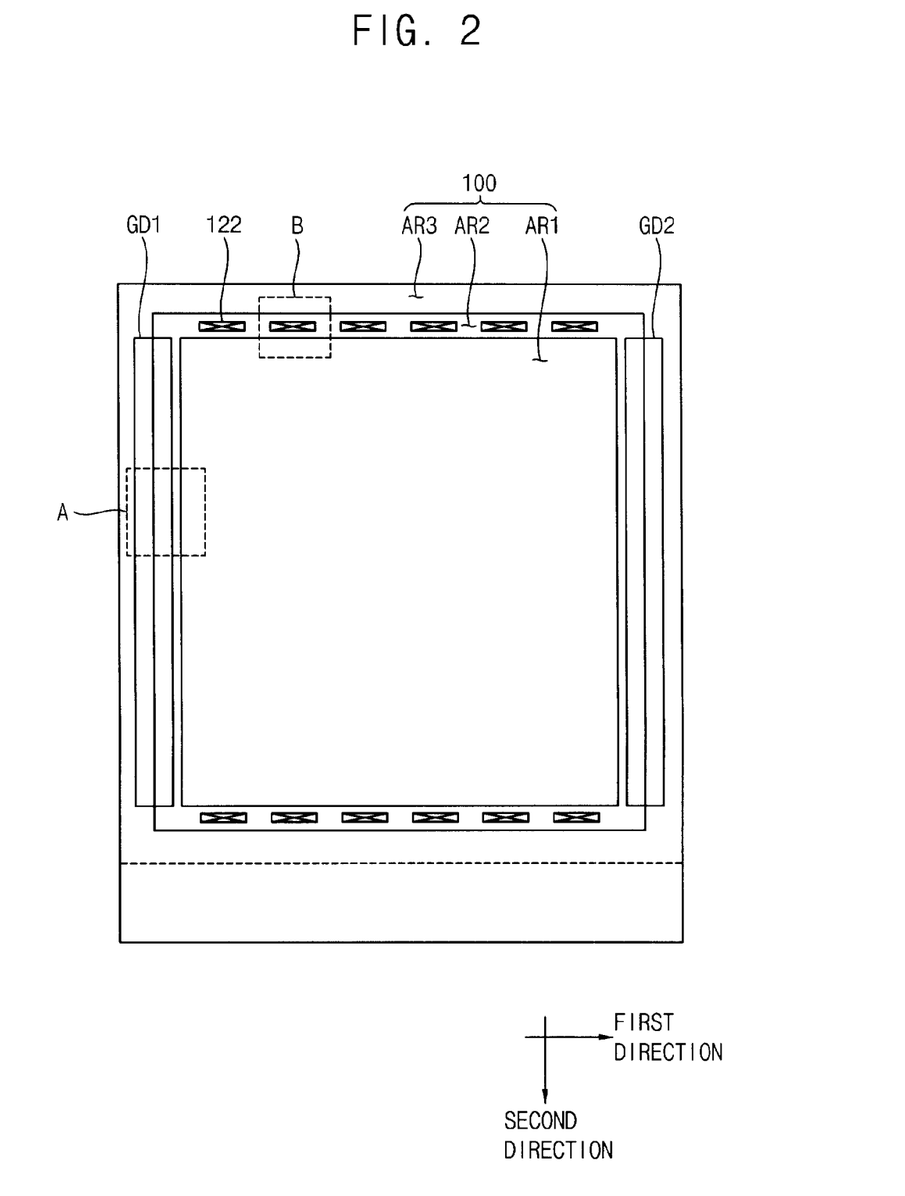
FIG. 2 is a plan view illustrating an exemplary embodiment of an array substrate of the display panel illustrated in FIG. 1.

FIG. 2 is a plan view illustrating an exemplary embodiment of an array substrate of the display panel illustrated in FIG. 1.

Referring to FIG. 2, the array substrate 100 includes pixel portions (not shown), gate lines (not shown), data lines (not shown) and a gate driving section.

The gate lines extend in a first direction. The data lines extend in a second direction crossing the first direction. The second direction may be substantially perpendicular with the first direction.

The pixel portions are electrically connected to the gate lines and the data lines. The gate driving section is electrically connected to the gate lines.

The array substrate 100 has a display area AR1, a boundary area AR2, and a light-blocking area AR3. The display area AR1 has, for example, a substantially rectangular shape viewed from a plan view, but is not limited thereto. The boundary area AR2 has a shape that surrounds the display area AR1 viewed from the plan view, such as being disposed on all sides of the display area AR1. The light-blocking area AR3 has a shape that substantially surrounds the boundary area AR2 viewed from the plan view, such as being disposed on all sides of the boundary area AR2.

The boundary area AR2 includes a left boundary area formed at a left side of the display area AR1, a right boundary area formed at a right side of the display area AR1, an upper boundary area formed at an upper side of the display area AR1, and a lower boundary area formed at a lower side of the display area AR1. Left, right, upper and lower are used herein with reference to a plan view, such as illustrated in FIG. 2.

The pixel portions may be formed in the display area AR1 to have a substantially matrix shape. The gate driving section overlaps the boundary area AR2. For example, the gate driving section (e.g., GD1, GD2) may be formed in the boundary area AR2 and the light-blocking area AR3 as shown in FIG. 2. Alternatively, the gate driving section may be formed only in the boundary area AR2.

In an exemplary embodiment, the gate driving section includes a first gate driving circuit GD1 formed at a first side (e.g., the left side of the plan view of FIG. 2) of the gate lines and electrically connected to first end portions of the gate lines, and a second gate driving circuit GD2 formed at a second side (e.g., the right side of the plan view of FIG. 2) of the gate lines to be electrically connected to second end portions of the gate lines.

For example, the first gate driving circuit GD1 overlaps the left boundary area of the boundary area AR2, and the second gate driving circuit GD2 overlaps the right boundary area of the boundary area AR2.

The second gate driving circuit GD2 is substantially the same as the first gate driving circuit GD1. Thus, only the first gate driving circuit GD1 will be described in detail, and any further description for the second gate driving circuit GD2 will be omitted.

Figure 3:
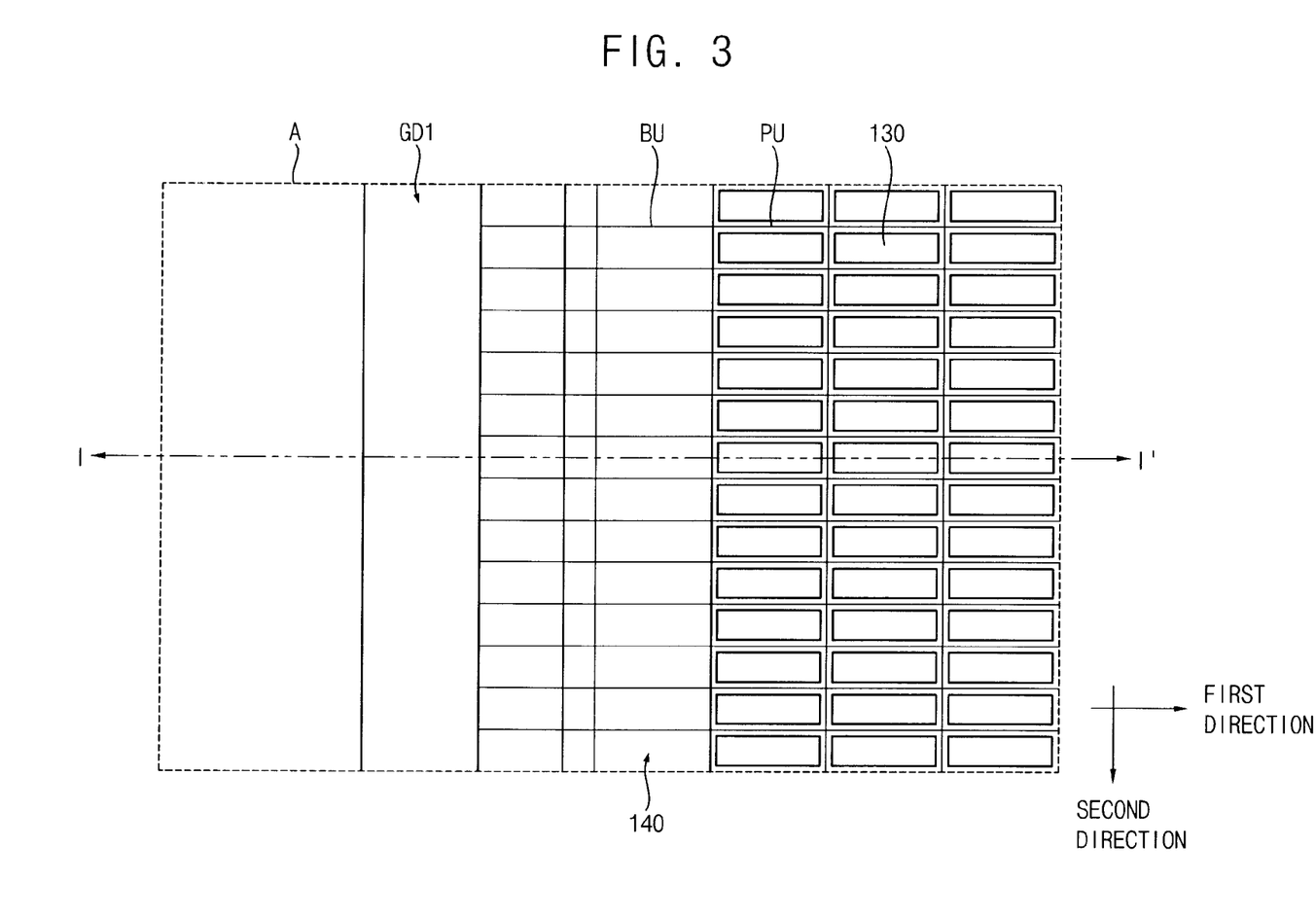
FIG. 3 is an enlarged plan view of portion 'A' in FIG. 2.
Figure 4:
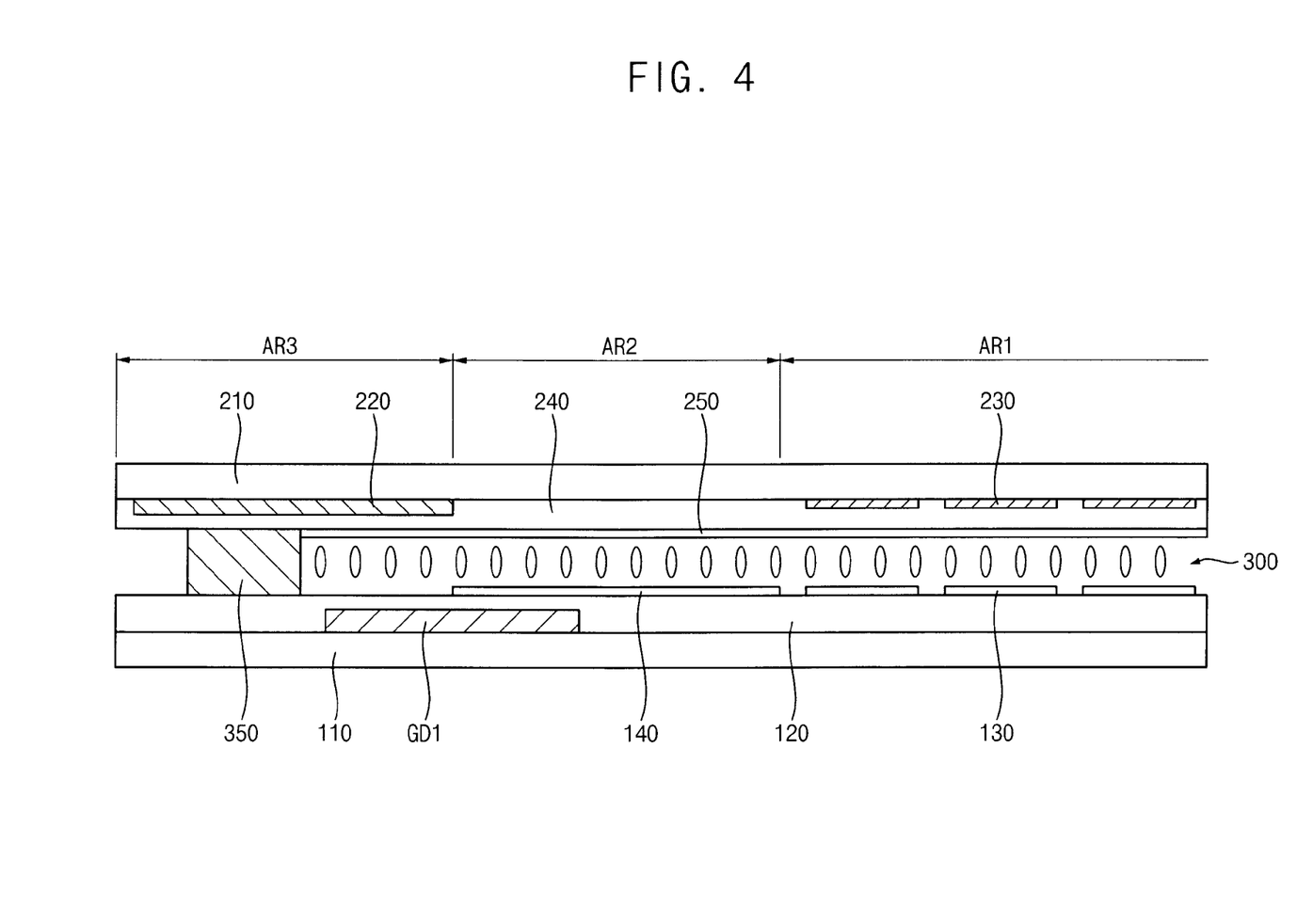
FIG. 4 is a cross-sectional view taken along line I-I' in FIG. 3.

FIG. 3 is an enlarged plan view of portion 'A' in FIG. 2. FIG. 4 is a cross-sectional view taken along line I-I' in FIG. 3.

Referring to FIGS. 2, 3 and 4, the array substrate 100 includes a first base substrate 110, gate lines (not shown), a gate insulation layer (not shown), data lines (not shown), a first gate driving circuit GD1, a protective layer 120, pixel portions and a boundary electrode 140.

In exemplary embodiments, the first base substrate 110 may have a substantially plate shape, and may include, for example, transparent glass, quartz, or synthesized resin.

The gate lines are formed on the first base substrate 110. The gate insulation layer is formed on the first base substrate 110 to cover the gate lines. The data lines are formed on the gate insulation layer.

The first gate driving circuit GD1 is formed on the first base substrate 110 or the gate insulation layer to overlap the boundary area AR2.

The protective layer 120 is formed on the gate insulation layer to cover the gate lines, the data lines and the first gate driving circuit GD1. In an exemplary embodiment, the protective layer 120 may correspond to and also be referred to as an organic insulation layer.

The pixel portions include thin-film transistors ("TFTs") (not shown) and pixel electrodes 130. The TFTs are electrically connected to the gate lines and the data lines, and are covered with the protective layer 120. The pixel electrodes 130 are formed on the protective layer 120. In exemplary embodiments, the pixel electrodes 130 may be spaced apart from each other, each in a pixel unit area PU. For example, in one exemplary embodiment, pixel unit areas PU may be defined by the gate lines and the data lines, but the invention is not limited thereto.

The boundary electrode 140 is formed on the protective layer 120 corresponding to the boundary area AR2. The boundary electrode 140 may include a transparent and conductive material, which may be the same as the pixel electrodes 130 in an exemplary embodiment. As used herein, "corresponding" may be used to indicate corresponding substantially in shape, dimension and/or positional placement relative to another feature.

The boundary area AR2 may have a plurality of boundary unit areas BU. Each of the boundary unit areas BU may have substantially the same size as each of the pixel unit areas PU. The pixel unit areas PU and the boundary unit areas BU may have, for example, a substantially rectangular shape that has a longer side in the first direction than the second direction.

The boundary electrode 140 may have an integrated form over the boundary area AR2. As used herein, "integrated" may be used to indicate disposed to be a single unit or feature rather than a group of separate elements or features. In one exemplary embodiment, the boundary electrode 140 may have an integrated form and be disposed over all of the boundary unit areas BU.

As a result, a portion of the first gate driving circuit GD1 is disposed below the boundary electrode 140, such that the first gate driving circuit GD1 overlaps the boundary electrode 140. Since the gate driving circuit GD1 is disposed between the boundary electrode 140 and the first base substrate 110 (e.g., in a vertical direction in FIG. 4), and overlapping the boundary area AR2, a width (e.g., in the first direction, or horizontally in FIG. 4) of an outer light-blocking layer covering a portion of the gate driving section may be reduced. Advantageously, the light-blocking area AR3 of the display panel may be reduced.

Figure 5:
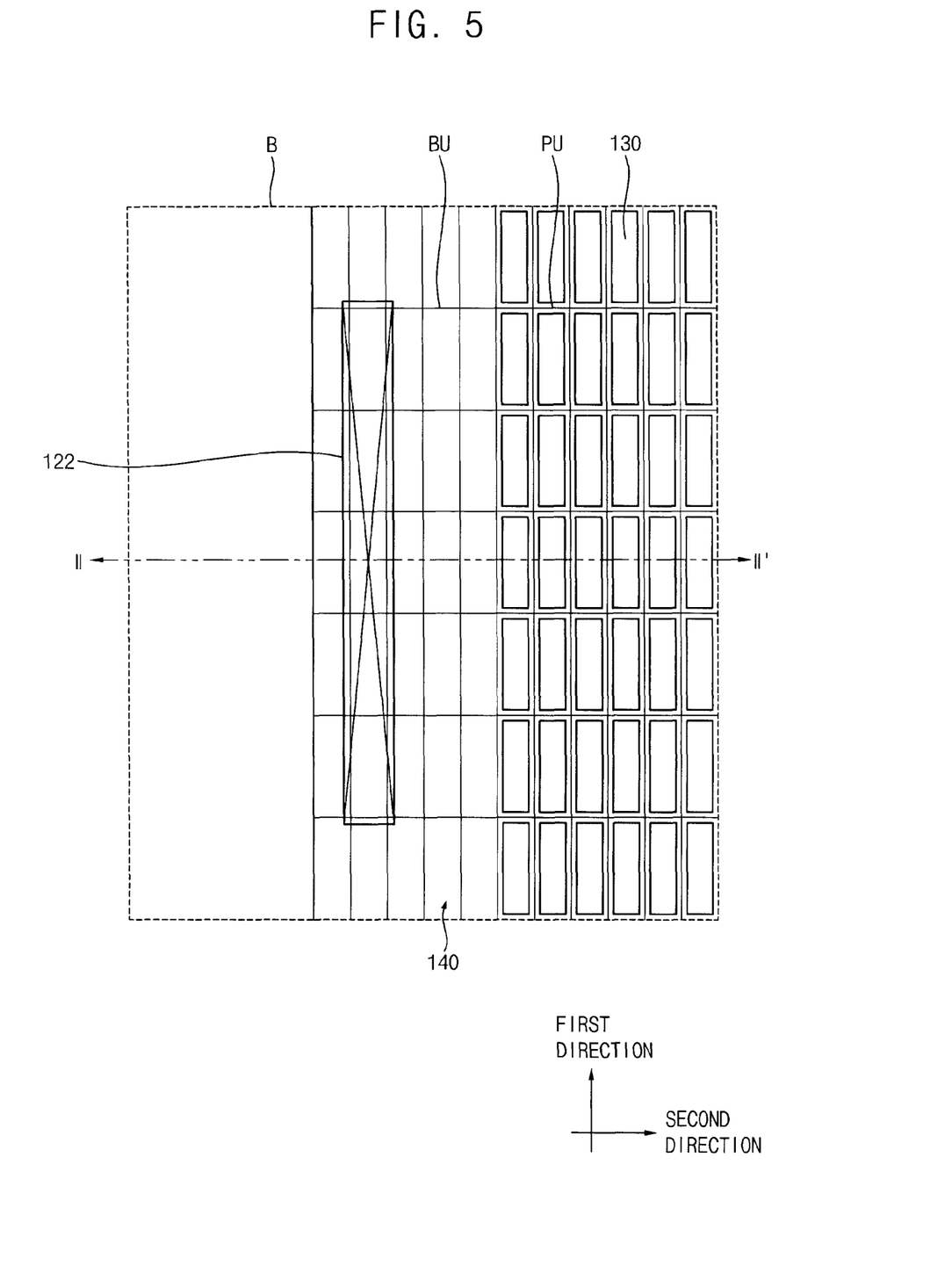
FIG. 5 is an enlarged plan view of portion 'B' in FIG. 2.
Figure 6:
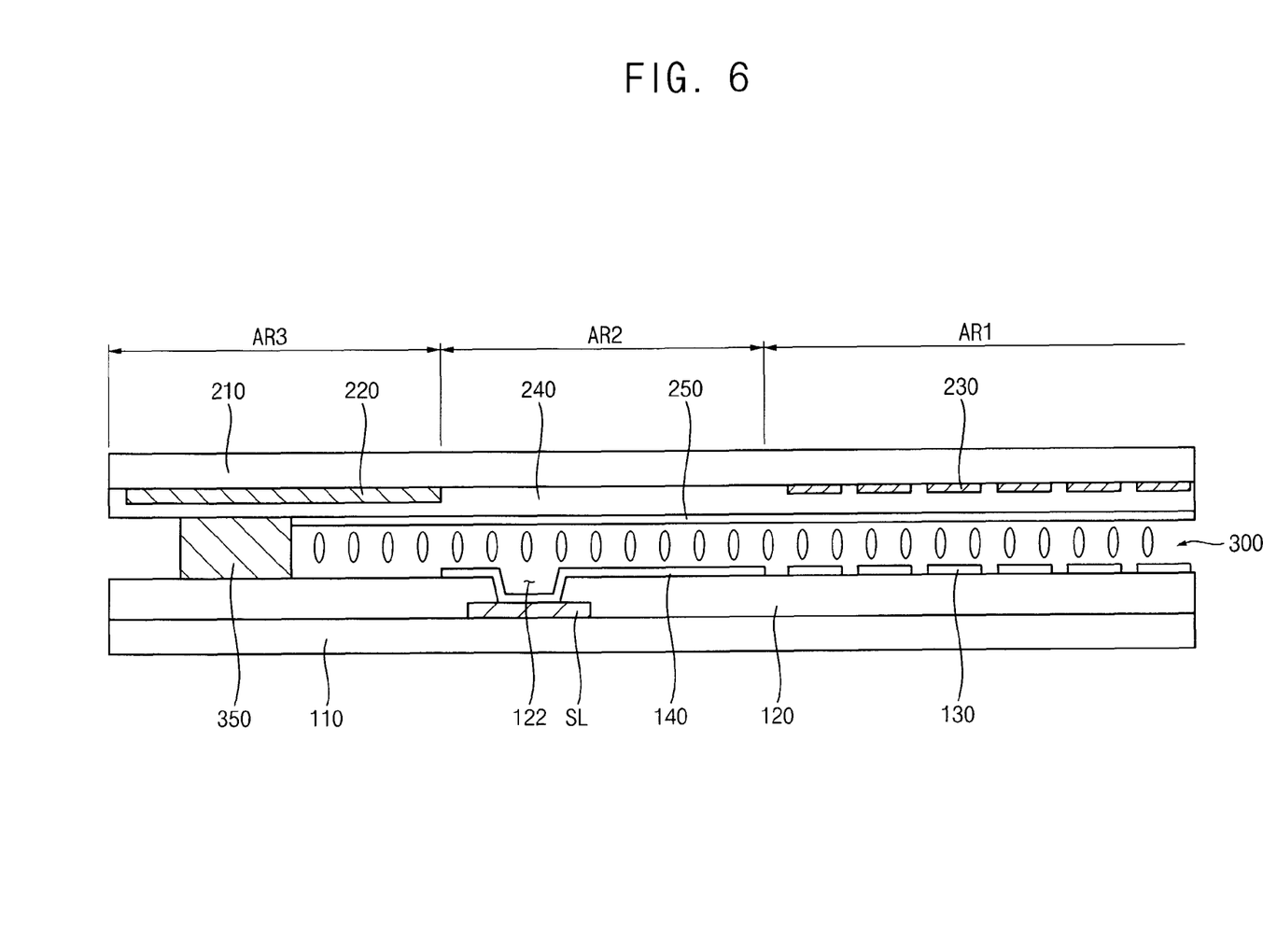
FIG. 6 is a cross-sectional view taken along line II-II' in FIG. 5.

FIG. 5 is an enlarged plan view of portion 'B' in FIG. 2. FIG. 6 is a cross-sectional view taken along line II-II' in FIG. 5.

Referring to FIGS. 2, 5 and 6, the array substrate 100 may further include a common voltage line SL.

The common voltage line SL may be formed in at least one of the upper and lower boundary areas of the boundary area AR2. Although not shown in FIGS. 2, 5 and 6, the common voltage line SL may be formed in the display area AR1 to overlap the pixel electrode 130.

In an exemplary embodiment, the common voltage line SL may be formed from the same layer as the gate lines, and externally receives a common voltage.

A boundary contact hole 122 may be formed through the protective layer 120 and electrically connect the boundary electrode 140 to the common voltage line SL. The boundary contact hole 122 is formed in at least one of the upper and lower boundary areas of the boundary area AR2, corresponding to the common voltage line SL. A plurality of boundary contact holes 122 may be formed extending along the first direction, and arranged in a transverse direction, as shown in FIGS. 2, 5 and 6. Alternatively, a single boundary contact hole 122, such as may be considered as an integrated form.

Referring to FIGS. 1, 4 and 6, the opposite substrate 200 includes a second base substrate 210, an outer light-blocking layer 220, color filters 230, a planarizing layer 240 and a common electrode 250.

The second base substrate 210 may have a substantially plate shape. The second base substrate 210 may include, for example, transparent glass, quartz or synthesized resin. The second base substrate 210 faces the first base substrate 110 of the array substrate 100.

The outer light-blocking layer 220 is formed on the second base substrate 210 and corresponding to the light-blocking area AR3 of the array substrate 100. The outer light-blocking layer 220 may be formed corresponding to substantially a whole of or a portion of the light-blocking area AR3.

The color filters 230 are formed on the second base substrate 210 corresponding to the display area AR1 of the array substrate 100. The color filters 230 may be formed at locations corresponding to the pixel electrodes 130, for example, with a one-to-one correspondence such as illustrated in FIGS. 4 and 6, but the invention is not limited thereto.

The planarizing layer 240 is formed on the second base substrate 210 to cover the outer light-blocking layer 220 and the color filters 230.

The common electrode 250 may include a transparent and conductive material, and/or may be formed on an entire area of the planarizing layer 240. The common electrode 250 externally receives the common voltage, such as is the same as that received by the common voltage line SL.

Accordingly, no electric field is generated between the common electrode 250 and the boundary electrode 140 that correspond to the boundary area AR2. Thus, when the display panel (e.g., FIG. 1) is operated in a normally black mode, the display panel displays black images in the boundary area AR2, and when the display panel is operated in a normally white mode, the display panel displays whites image in the boundary area AR2.

A seal member (e.g., line) 350 is formed between the array substrate 100 and the opposite substrate 200, and seals the liquid crystal layer 300 between the array substrate 100 and the opposite substrate 200. For example, the seal line 350 is disposed in the light-blocking area AR3, and couples the array substrate 100 to the opposite substrate 200.

Figure 7:
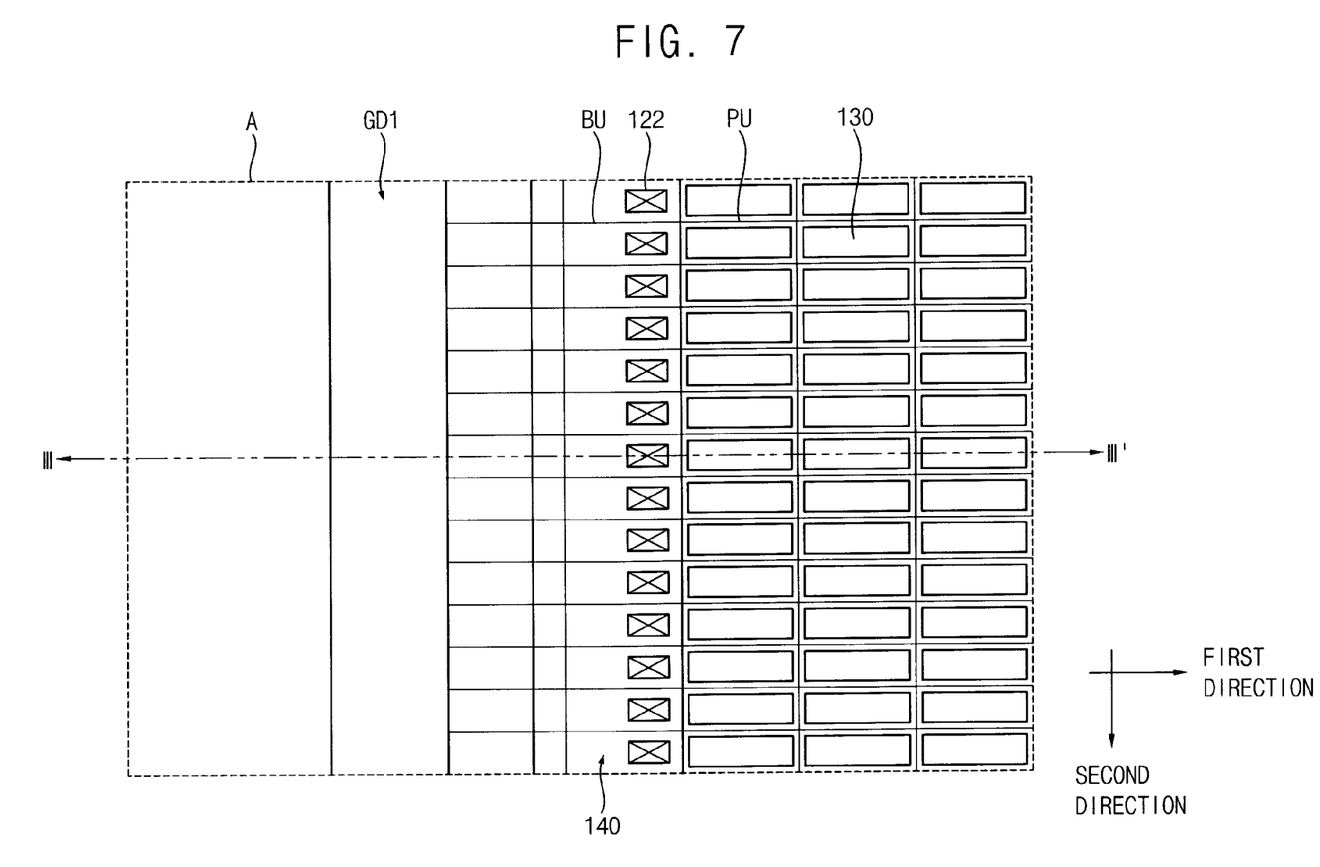
FIG. 7 is a plan view illustrating a portion of another exemplary embodiment of an array substrate of a display panel according to the present invention.
Figure 8:
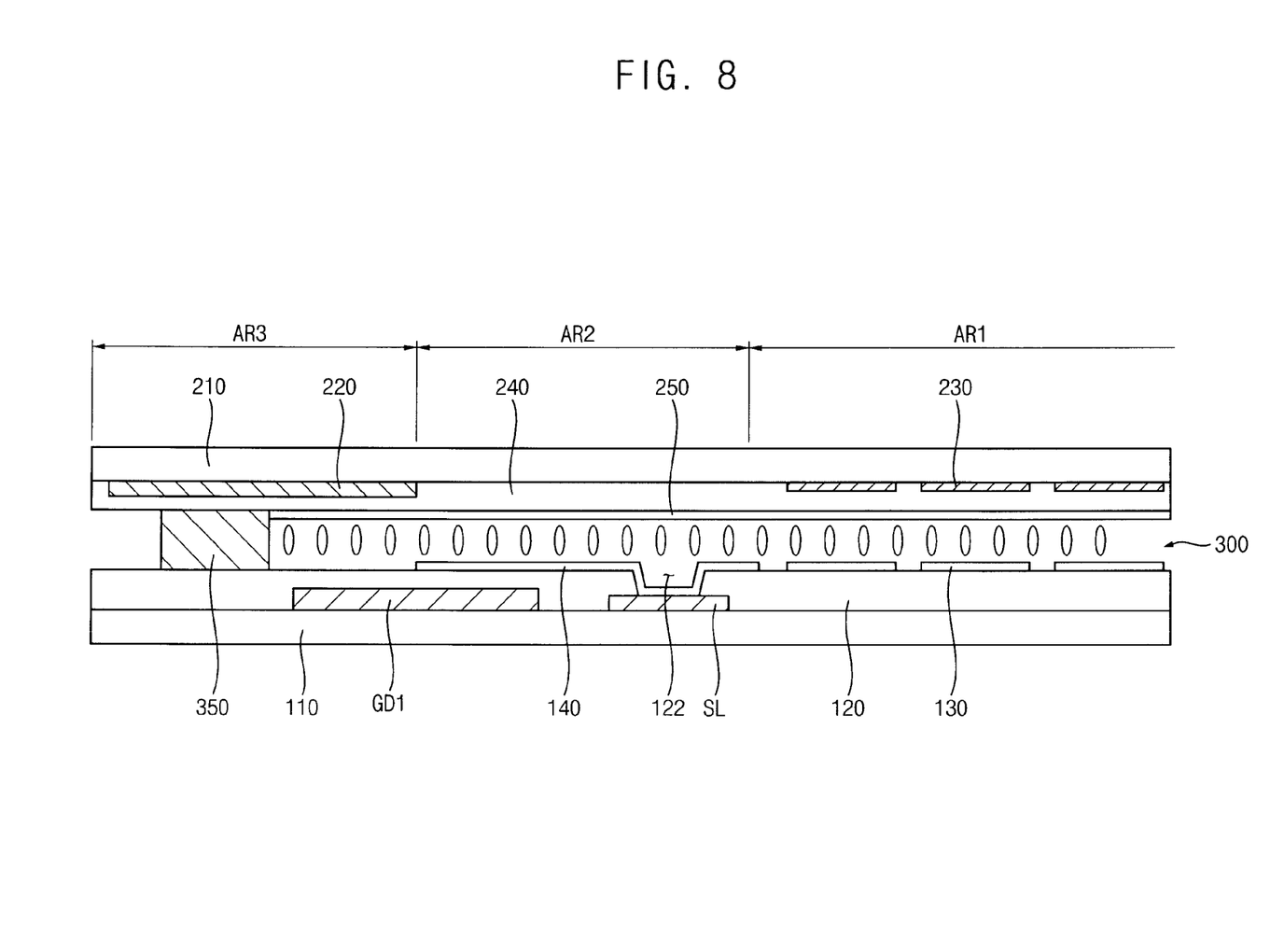
FIG. 8 is a cross-sectional view taken along line III-III' in FIG. 7.

FIG. 7 is a plan view illustrating a portion of another exemplary embodiment of an array substrate of a display panel according to the present invention. FIG. 8 is a cross-sectional view taken along line III-III' in FIG. 7.

The array substrate illustrated in FIGS. 7 and 8 is substantially the same as the array substrate illustrated in FIGS. 3 and 4 except for the common voltage line SL and the boundary contact hole 122. Thus, only the common voltage line SL and the boundary contact hole 122 will be described in detail with reference to FIGS. 7 and 8.

Referring to FIGS. 7 and 8, the common voltage line SL is formed in at least one of the upper and lower boundary areas of the boundary area AR2, and spaced apart from the gate driving section. For example, the common voltage line SL may be formed on the first base substrate 110, and disposed spaced apart from the first gate driving circuit GD1 as illustrated in FIG. 8.

Although not shown in FIGS. 7 and 8, the common voltage line SL may be formed in the display area AR1 to overlap the pixel electrode 130. In an exemplary embodiment, the common voltage line SL may be formed from the same layer as the gate lines, and externally receives a common voltage.

A boundary contact hole 122 is formed through the protective layer 120 to electrically connect the boundary electrode 140 to the common voltage line SL.

The boundary contact hole 122 may be formed in at least one of the upper and lower boundary areas of the boundary area AR2, corresponding to the common voltage line SL. A plurality of boundary contact holes 122 may be formed and arranged along the second direction as shown in FIGS. 7 and 8. Alternatively, one boundary contact hole 122 may be formed with an integrated form instead of a plurality of the contact holes 122.

Since the gate driving circuit GD1 is disposed between the boundary electrode 140 and the first base substrate 110 (e.g., in a vertical direction in FIG. 6), and overlapping the boundary area AR2, a width (e.g., in the first direction, or horizontally in FIG. 6) of an outer light-blocking layer covering a portion of the gate driving section may be reduced. Advantageously, the light-blocking area AR3 of the display panel may be reduced.

Figure 9:
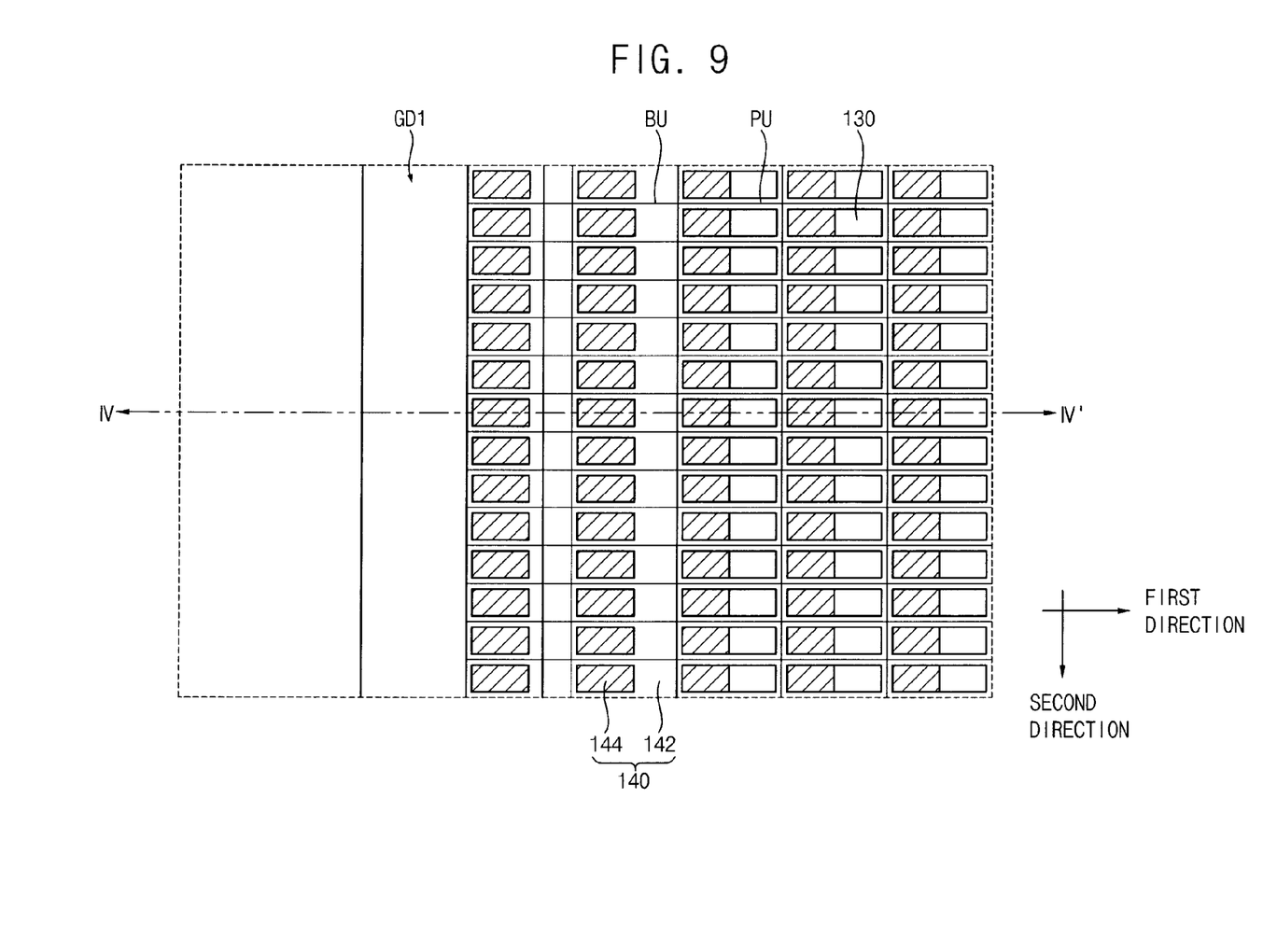
FIG. 9 is a plan view illustrating a portion of another exemplary embodiment of an array substrate of a display panel according to the present invention.
Figure 10:
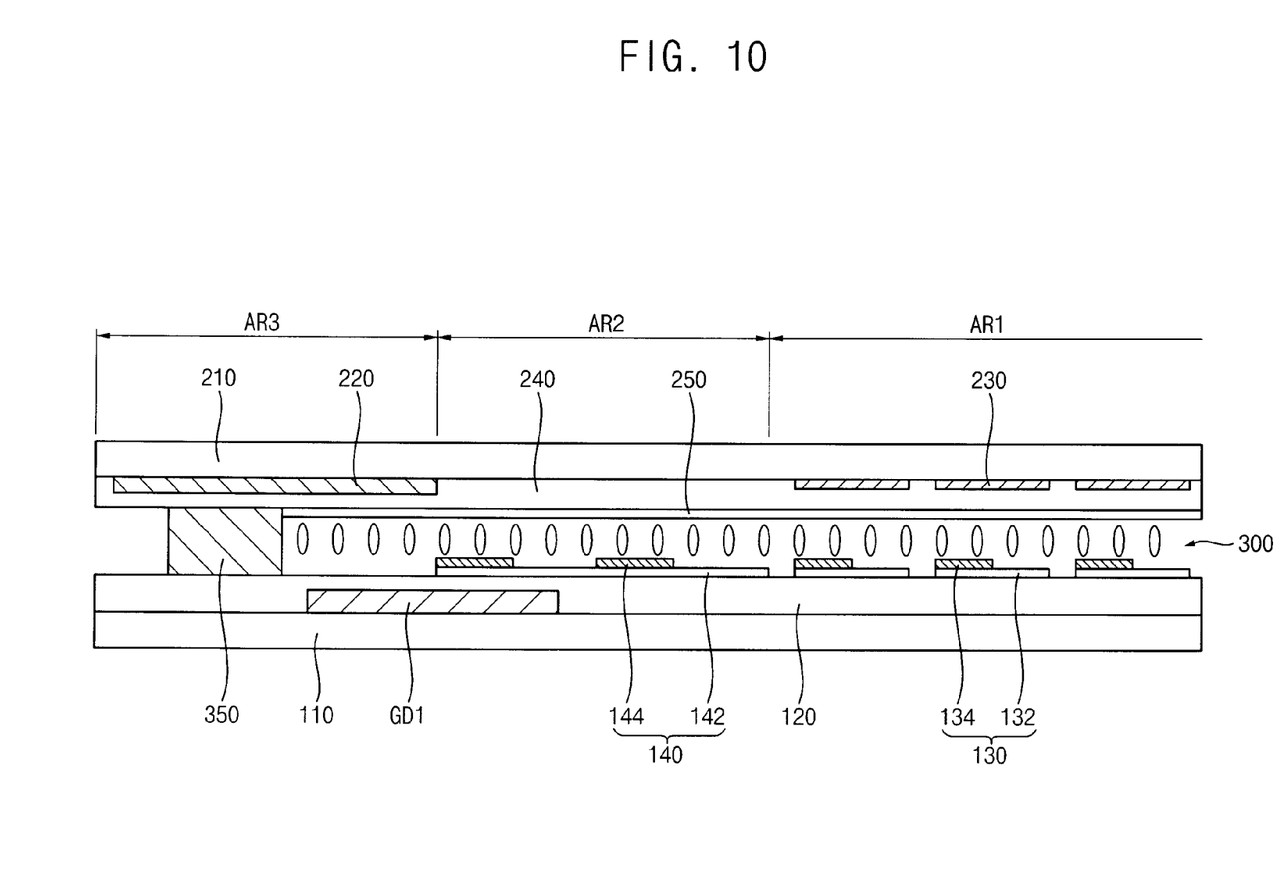
FIG. 10 is a cross-sectional view taken along line IV-IV' in FIG. 9.

FIG. 9 is a plan view illustrating a portion of another exemplary an array substrate of a display panel according to the present invention. FIG. 10 is a cross-sectional view taken along line IV-IV' in FIG. 9.

The array substrate illustrated in FIGS. 9 and 10 is substantially the same as the array substrate illustrated in FIGS. 3 and 4 except for the pixel electrodes 130 and the boundary electrode 140. Thus, only the pixel electrodes 130 and the boundary electrode 140 will be described in detail with reference to FIGS. 9 and 10.

Referring to FIGS. 9 and 10, the pixel electrodes 130 are formed on the protective layer 120. The pixel electrodes 130 may be spaced apart from each other, and each disposed in a pixel unit area PU. For example, in one exemplary embodiment, pixel unit areas PU may be defined by the gate lines and the data lines, but the invention is not limited thereto.

Each of the pixel electrodes 130 includes a pixel transmissive electrode 132 and a pixel reflective electrode 134. The pixel transmissive electrode 132 is formed on the protective layer 120 and corresponding to each of the pixel unit areas PU. The pixel reflective electrode 134 is formed on the pixel transmissive electrode 132 corresponding to a portion of each of the pixel unit areas PU. The pixel reflective electrode 134 may be formed on a portion of the pixel transmissive electrode 132, and positioned at any of a number of locations on the transmissive electrode 132, such as left-justified (FIG. 10), substantially centered or right-justified.

As a result, the display panel may display images through the display area AR1 by using external light and/or internal light.

The boundary electrode 140 is formed on the protective layer 120 and corresponding to the boundary area AR2. The boundary area AR2 may have a plurality of boundary unit areas BU. In an exemplary embodiment, each of the boundary unit areas BU may have substantially the same size as each of the pixel unit areas PU, however, the invention is not limited thereto.

The boundary electrode 140 includes a boundary transmissive electrode 142 and a boundary reflective electrode 144. The boundary transmissive electrode 142 may be formed on the protective layer 120 and have an integrated form over the boundary area AR2, such as to be disposed on substantially a whole of the boundary area AR2. Thus, the boundary transmissive electrode 142 may have an integrated form over all of the boundary unit areas BU, or a boundary transmissive electrode 142 may be disposed individually on each of the boundary unit areas BU.

A plurality of boundary reflective electrodes 144 may be formed on the boundary transmissive electrode 142 and corresponding to a portion of each of the boundary unit areas BU. Alternatively, the boundary reflective electrode 144 may have an integrated form disposed on the boundary transmissive electrode 142 and cover a portion of each of the boundary unit areas BU.

As a result, the display panel may display white images or black images through the boundary area AR2 by using external light and/or internal light.

Since the gate driving circuit GD1 is disposed between the boundary electrode 140 and the first base substrate 110 (e.g., in a vertical direction in FIG. 10), and overlapping the boundary area AR2, a width (e.g., in the first direction, or horizontally in FIG. 10) of an outer light-blocking layer covering a portion of the gate driving section may be reduced. Advantageously, the light-blocking area AR3 of the display panel may be reduced.

Figure 11:
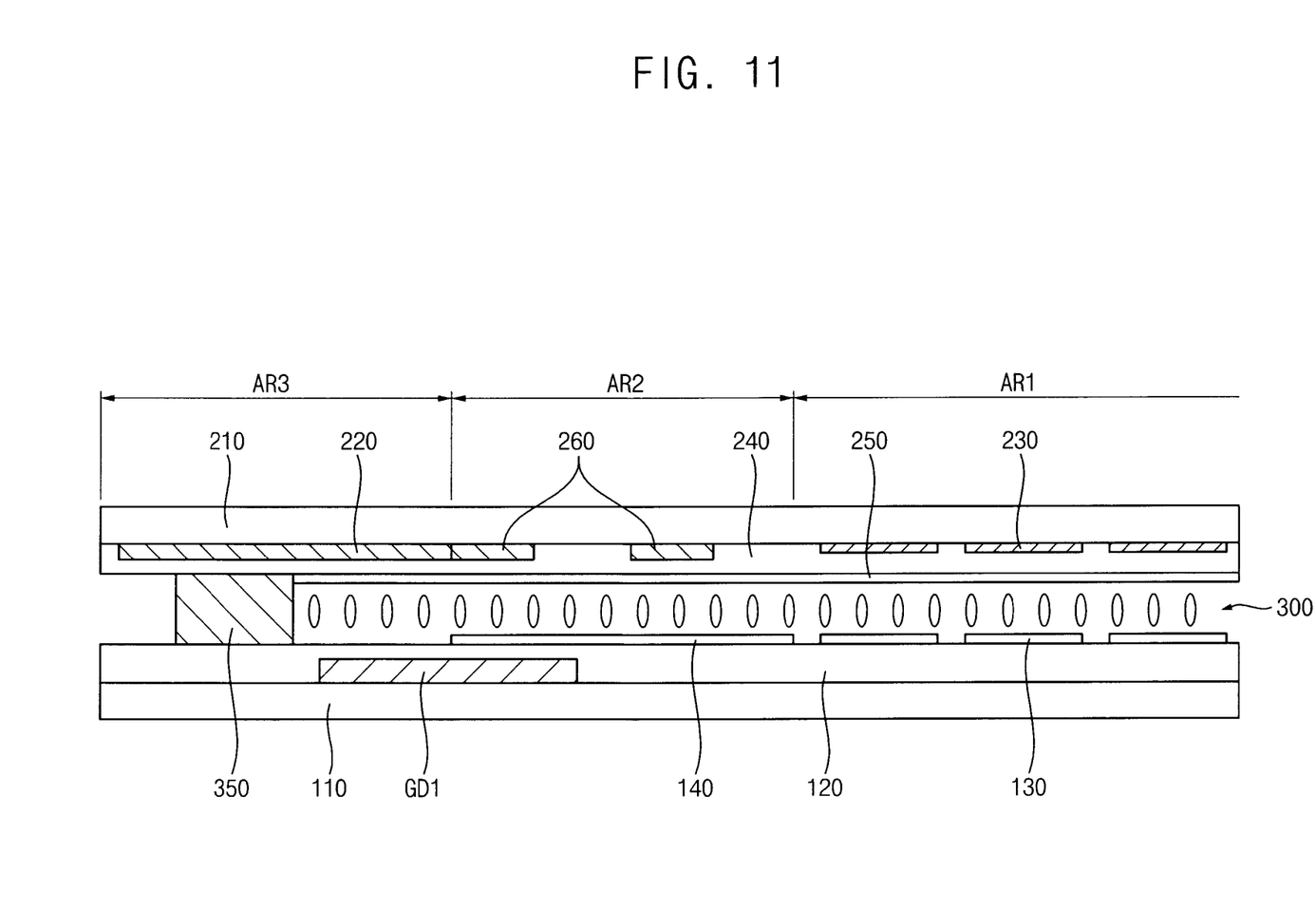
FIG. 11 is a cross-sectional view illustrating a portion of another exemplary embodiment of an array substrate of a display panel according to the present invention.

FIG. 11 is a cross-sectional view illustrating another exemplary embodiment of a portion of an array substrate of a display panel according to the present invention.

The array substrate illustrated in FIG. 11 is substantially the same as the array substrate illustrated in FIG. 4 except that the opposite substrate includes a boundary light-blocking layer 260. Thus, only the boundary light-blocking layer 260 will be described in detail with reference to FIGS. 1, 3 and 11.

Referring to FIGS. 1, 3 and 11, the boundary light-blocking layer 260 is formed on the second base substrate 210 and covered with the planarizing layer 240.

In an exemplary embodiment, the boundary light-blocking layer 260 may be formed on the second base substrate 210 to cover a portion of each of the boundary unit areas BU. A plurality of boundary light-blocking layer 260 may be formed corresponding to a portion of each of the boundary unit areas BU. Alternatively, the boundary light-blocking layer 260 may have an integrated form (e.g., be formed as a single feature) and cover a portion of each of the boundary unit areas BU.

When the display panel displays white images by using the boundary area AR2, the boundary light-blocking layer 260 may adjust the luminance of the white images. For example, when an partial area of each of the boundary unit areas BU covered by the boundary light-blocking layer 260 increases, the luminance of the white images may decrease. In contrast, when the area of each of the boundary unit areas BU covered by the boundary light-blocking layer 260 decreases, the luminance of the white images may increase.

Since the gate driving circuit GD1 is disposed between the boundary electrode 140 and the first base substrate 110 (e.g., in a vertical direction in FIG. 11), and overlapping the boundary area AR2, a width (e.g., in the first direction, or horizontally in FIG. 11) of an outer light-blocking layer covering a portion of the gate driving section may be reduced. Advantageously, the light-blocking area AR3 of the display panel may be reduced.

Figure 12:
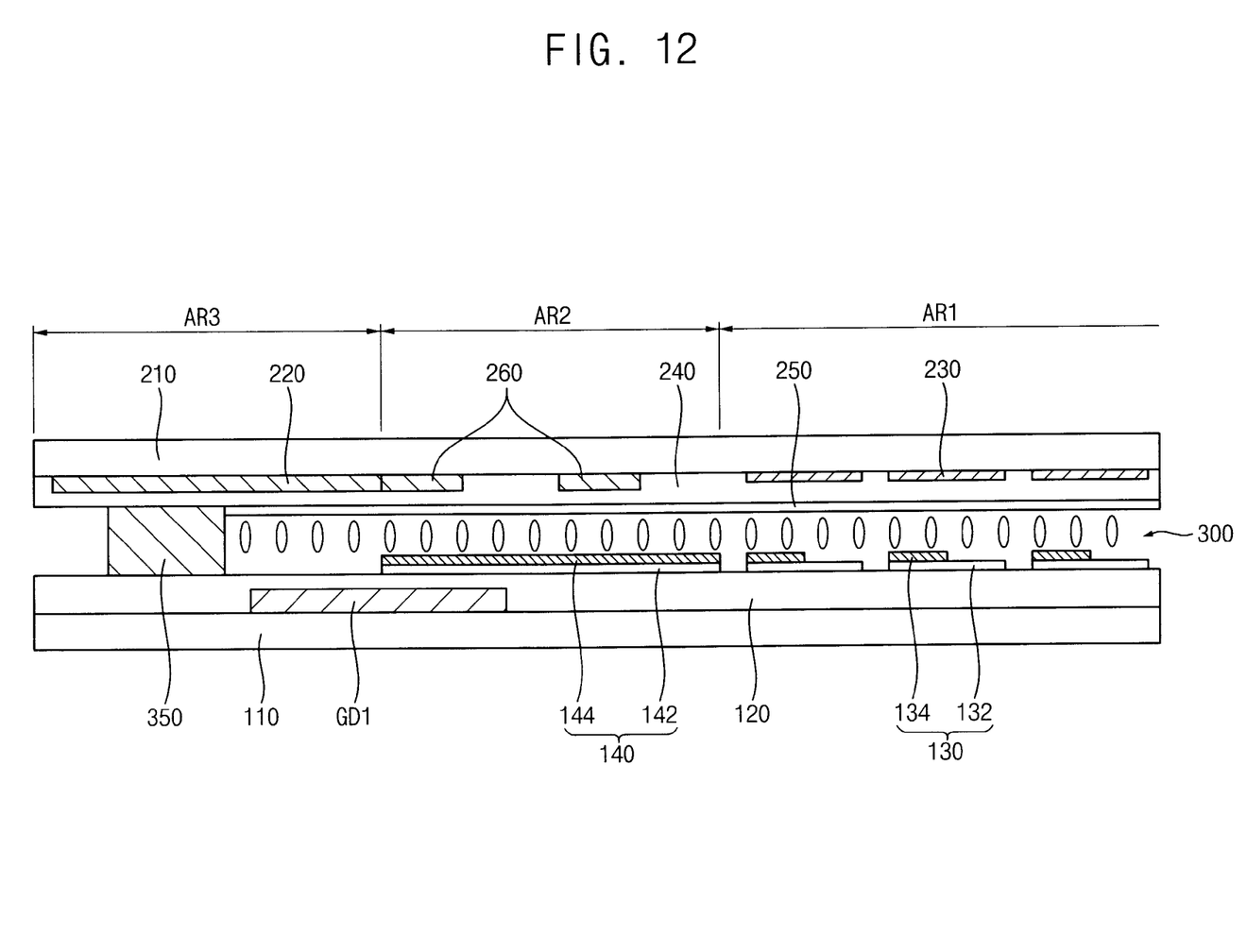
FIG. 12 is a cross-sectional view illustrating a portion of another exemplary embodiment of an array substrate of a display panel according to the present invention.

FIG. 12 is a cross-sectional view illustrating another exemplary embodiment of a portion of an array substrate of a display panel according to the present invention.

The array substrate illustrated in FIG. 12 is substantially the same as the array substrate illustrated in FIG. 11 except for the pixel electrodes 130 and the boundary electrode 140. Thus, only the pixel electrodes 130 and the boundary electrode 140 will be described in detail with reference to FIGS. 3 and 12.

Referring to FIGS. 3 and 12, the pixel electrodes 130 are formed on the protective layer 120. The pixel electrodes 130 may be spaced apart from each other, such as each pixel electrode being disposed in a pixel unit area PU. In one exemplary embodiment, for example, pixel unit areas PU may be defined by the gate lines and the data lines, but the invention is not limited thereto.

Each of the pixel electrodes 130 includes a pixel transmissive electrode 132 and a pixel reflective electrode 134. The pixel transmissive electrode 132 is formed on the protective layer 120 corresponding to each of the pixel unit areas PU. The pixel reflective electrode 134 is formed on the pixel transmissive electrode 132 corresponding to a portion of each of the pixel unit areas PU and a portion of the transmissive electrode 132.

As a result, the display panel may display images through the display area AR1 by using external light and/or internal light.

The boundary electrode 140 is formed on the protective layer 120 and corresponding to the boundary area AR2. The boundary area AR2 may have a plurality of boundary unit areas BU. Each of the boundary unit areas BU may have substantially the same size as each of the pixel unit areas PU.

The boundary electrode 140 includes a boundary transmissive electrode 142 and a boundary reflective electrode 144. The boundary transmissive electrode 142 may be formed on the protective layer 120 to have an integrated form over the boundary area AR2. The boundary reflective electrode 144 may also be formed on the boundary transmissive electrode 142 to have an integrated form over the boundary area AR2.

Thus, each of the boundary transmissive electrode 142 and the boundary reflective electrode 144 may have an integrated form over all of the boundary unit areas BU. As a result, the display panel may display white images or black images through the boundary area AR2 by using external light. When the display panel displays white images by using the boundary area AR2, the boundary light-blocking layer 260 may adjust the luminance of the white image.

In FIG. 12, the boundary electrode 140 includes the boundary transmissive electrode 142 and the boundary reflective electrode 144. Alternatively, the boundary electrode 140 may include only the boundary reflective electrode 144. Thus, the boundary transmissive electrode 142 may be omitted, and the boundary reflective electrode 144 may be formed directly on the protective layer 120.

As described above for the illustrated embodiments, the gate driving section is formed between the boundary electrode 140 and the first base substrate 110 to overlap the boundary area AR2. Advantageously, an increase in a width of the outer light-blocking layer 220 covering the gate driving section may be reduced or effectively prevented, thereby reducing a width of the light-blocking area AR3.

As in the illustrated embodiments, a gate driving section is formed between a boundary electrode and a first base substrate to overlap a boundary area, thereby reducing or effectively preventing an increase in a width of an outer light-blocking layer covering the gate driving section. Advantageously, a light-blocking area of a display panel may be reduced.

Although exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. An array substrate comprising:
a base substrate including a display area, a boundary area surrounding the display area and a light-blocking area surrounding the boundary area;
a plurality of gate lines extending in a first direction and disposed on the base substrate;
a plurality of data lines extending in a second direction crossing the first direction and disposed on the base substrate;
a plurality of pixel portions disposed in the display area and electrically connected to the gate and data lines;
a gate driving section electrically connected to the gate lines, a portion of the gate driving section overlapping the boundary area; and
a boundary electrode disposed above and overlapping the gate driving section, and corresponding to the boundary area.

2. The array substrate of claim 1, wherein a portion of the gate driving section is disposed in the light-blocking area.

3. The array substrate of claim 1, wherein the pixel portions comprise:
a plurality of thin-film transistors ("TFTs") electrically connected to the gate and data lines; and
a plurality of pixel electrodes disposed in pixel unit areas defined in the display area and electrically connected to the TFTs.

4. The array substrate of claim 3, further comprising a protective layer covering the gate lines, the data lines, the TFTs and the gate driving section, wherein the pixel electrode and the boundary electrode are disposed on the protective layer.

5. The array substrate of claim 4, further comprising a common voltage line covered with the protective layer, and electrically connected to the boundary electrode through a boundary contact hole extending through the protective layer.

6. The array substrate of claim 5, wherein the boundary area includes:
a left boundary area disposed at a left side of the display area;
a right boundary area disposed at a right side of the display area;
an upper boundary area disposed at an upper side of the display area; and
a lower boundary area disposed at a lower side of the display area.

7. The array substrate of claim 6, wherein the boundary contact hole is disposed in one of the upper and lower boundary areas.

8. The array substrate of claim 6, wherein the boundary contact hole is disposed in one of the left and right boundary areas, and spaced apart from the gate driving section.

9. The array substrate of claim 1, wherein the boundary electrode has an integrated form over the boundary area.

10. The array substrate of claim 1, wherein the boundary electrode includes a reflective electrode to display a white image in the boundary area.

11. The array substrate of claim 1, wherein the gate driving section comprises:
a first gate driving circuit electrically connected to first end portions of the gate lines; and
a second gate driving circuit electrically connected to second end portions of the gate lines.

12. A display panel comprising:
an array substrate comprising:
a base substrate including a display area, a boundary area surrounding the display area and a light-blocking area surrounding the boundary area;
a plurality of gate lines extending in a first direction and disposed on the base substrate;
a plurality of data lines extending in a second direction crossing the first direction and disposed on the base substrate;
a plurality of pixel portions disposed in the display area and electrically connected to the gate and data lines;
a gate driving section electrically connected to the gate lines, a portion of the gate driving section overlapping the boundary area; and
a boundary electrode disposed above and overlapping the gate driving section, and corresponding to the boundary area
an opposite substrate facing the array substrate; and
a liquid crystal layer interposed between the array substrate and the opposite substrate.

13. The display panel of claim 12, wherein the gate driving section is disposed in the boundary area and the light-blocking area.

14. The display panel of claim 12,
wherein the pixel portions comprise a plurality of thin-film transistors ("TFTs") electrically connected to the gate and data lines; and
wherein the array substrate further comprises
a protective layer covering the gate lines, the data lines, the TFTs and the gate driving section.

15. The display panel of claim 14, wherein the opposite substrate comprises an outer light-blocking layer disposed corresponding to the light-blocking area of the array substrate.

16. The display panel of claim 15, wherein the boundary electrode has an integrated form over the boundary area.

17. The display panel of claim 16, wherein the boundary electrode comprises a transmissive electrode.

18. The display panel of claim 17, wherein the boundary area includes a plurality of boundary unit areas, and the boundary electrode further comprises a reflective electrode disposed on the transmissive electrode and corresponding to a portion of each of the boundary unit areas.

19. The display panel of claim 17, wherein the boundary area includes a plurality of boundary unit areas, and the opposite substrate further comprises a boundary light-blocking layer disposed corresponding to a portion of each of the boundary unit areas.

20. The display panel of claim 16, wherein the boundary electrode comprises a reflective electrode.

21. The display panel of claim 20, wherein the boundary electrode further comprises a transmissive electrode disposed between the protective layer and the reflective electrode.

22. The display panel of claim 20, wherein the boundary area includes a plurality of boundary unit areas, and the opposite substrate further comprises a boundary light-blocking layer disposed corresponding to a portion of each of the boundary unit areas.

23. A method of forming an array substrate of a display panel, the method comprising:

forming a base substrate including a display area, a boundary area surrounding the display area and a light-blocking area surrounding the boundary area;

forming a plurality of gate lines extending in a first direction and a plurality of data lines extending in a second direction crossing the first direction on the base substrate;

disposing a plurality of pixel portions in the display area and electrically connecting the plurality of pixel portions to the gate and data lines;

forming a gate driving section electrically connected to the gate lines, wherein a portion of the gate driving section overlaps the boundary area; and forming a boundary electrode disposed above and overlapping the gate driving section, and corresponding to the boundary area.

* * * * *